US012560638B2

(12) United States Patent
Böse

(10) Patent No.: US 12,560,638 B2
(45) Date of Patent: Feb. 24, 2026

(54) METHOD FOR DETERMINING AT LEAST ONE PROPERTY OF A ROTATIONAL MOVEMENT OF A THREE-PHASE ROTARY CURRENT MACHINE IN GENERATOR OPERATION AND ELECTROMECHANICAL DRIVE

(71) Applicant: dormakaba Deutschland GmbH, Ennepetal (DE)

(72) Inventor: Dennis Böse, Ennepetal (DE)

(73) Assignee: DORMAKABA DEUTSCHLAND GMBH, Ennepetal (DE)

( * ) Notice: Subject to any disclaimer, the term of this patent is extended or adjusted under 35 U.S.C. 154(b) by 177 days.

(21) Appl. No.: 18/482,293

(22) Filed: Oct. 6, 2023

(65) Prior Publication Data

US 2024/0125836 A1     Apr. 18, 2024

(30) Foreign Application Priority Data

Oct. 7, 2022     (EP) ..................................... 22200303

(51) Int. Cl.
| | |
|---|---|
| *G01R 25/00* | (2006.01) |
| *G01R 29/18* | (2006.01) |
| *H02P 27/04* | (2016.01) |

(52) U.S. Cl.
CPC ........... *G01R 29/18* (2013.01); *G01R 25/005* (2013.01); *H02P 27/047* (2013.01)

(58) Field of Classification Search
None
See application file for complete search history.

(56) References Cited

U.S. PATENT DOCUMENTS

| | | | |
|---|---|---|---|
| 8,248,005 B2 | 8/2012 | Roemer | |
| 9,501,047 B2 * | 11/2016 | Salutzki | ................ E05F 15/608 |
| 2007/0247099 A1 | 10/2007 | Lu et al. | |
| 2018/0248502 A1 | 8/2018 | Richards et al. | |

FOREIGN PATENT DOCUMENTS

| | | |
|---|---|---|
| DE | 102014212554 A1 | 12/2015 |
| EP | 2267881 A2 | 12/2010 |
| EP | 3245732 B1 | 9/2021 |

* cited by examiner

*Primary Examiner* — Richard Isla
(74) *Attorney, Agent, or Firm* — CANTOR COLBURN LLP

(57) ABSTRACT

A method for determining at least one property of a rotational movement of a three-phase rotary current machine in generator operation, with an electrical parameter for a phase voltage of the relevant phase of the three-phase alternating voltage of the rotary current machine generated in generator operation being continuously recorded metrologically for each of the three phases. Three electrical parameter pairs are formed from the three electrical parameters, whereby the three electrical parameter pairs respectively include electrical parameters of a first and a second phase, electrical parameters of the second phase and a third phase, and electrical parameters of the third phase and the first phase. A sign of a difference between the electrical parameters of each parameter pair is continuously determined. The property of the rotational movement is determined from change times corresponding to times of immediately successive sign changes of the differences between the three parameter pairs.

15 Claims, 2 Drawing Sheets

$\{t_{41}, t_{42}, t_{43}, t_{44}, ...\}$ $\{t_{51}, t_{52}, t_{53}, t_{54}, ...\}$ $\{t_{61}, t_{62}, t_{63}, t_{64}, ...\}$

METHOD FOR DETERMINING AT LEAST ONE PROPERTY OF A ROTATIONAL MOVEMENT OF A THREE-PHASE ROTARY CURRENT MACHINE IN GENERATOR OPERATION AND ELECTROMECHANICAL DRIVE

CROSS-REFERENCE TO RELATED APPLICATIONS

This application claims the benefit of European patent application 22200303.0, filed on 7 Oct. 2022, the disclosure of which is incorporated herein by reference in its entirety.

TECHNICAL FIELD

The disclosure relates to a method for determining at least one property of a rotational movement of a three-phase rotary current machine in generator operation. The disclosure also relates to an electromechanical drive for actuating a leaf, in particular a door leaf or a window leaf, rotatably and/or displaceably mounted on a structural element, with the electromechanical drive having a three-phase rotary current machine, with a drive shaft of the rotary current machine being in operative connection with the leaf via a power transmission device when the electromechanical drive is mounted as intended on the leaf and/or the structural element, so that a movement of the drive shaft in motor operation of the rotary current machine causes a movement of the leaf, with a movement of the leaf in generator operation of the rotary current machine causing a movement of the drive shaft.

BACKGROUND

Electromechanical drives for moving a leaf are known from the prior art. A leaf is thereby understood to mean, in particular, a door or window leaf. Such leaves are mounted in the structural elements surrounding the leaf, such as frames. The leaf thus represents the moving part and the structural element represents the fixed part. The term frame can therefore also mean any other structural element surrounding the leaf, in particular a building wall.

Such electromechanical drives often have an electric motor and a mechanical closing unit. The mechanical closing unit can be, for example, a spring that is tensioned by the electric motor when the leaf is opened or when the leaf is moved in an opening direction. The energy stored in the spring is used to close the leaf. During the closing process, the electric motor can be used to brake the leaf movement.

Even in the event of a fault and in particular in the event of a power failure, the leaf should be reliably braked. This not only affects the closing process, but also, in the event of a fault, the manually carried out opening process in order to avoid an uncontrolled impact in the opening end position.

In order to be able to use the electric motor for braking in the event of a fault, it is known to short-circuit phases of the electric motor, for example via diodes. If the electric motor rotates with a short-circuited phase, a voltage is induced, with the current flowing across the phase causing a braking torque. In this way, the electric motor can be used as a brake in generator operation. From the document EP 2 267 881 A2, it is known to supply the energy generated as a generator to a bipolar transistor as a load resistor. From the publication EP 3 245 732 B1, it is known to control the phase short circuit using pulse width modulation in such manner that a predefined current flow through the motor coils and thus a predefined braking torque results.

In order to control the braking effect in the event of a fault, information about the respective movement of the leaf is required. In order to be able to control the generator operation appropriately, the movement direction of the leaf and the movement speed must in particular be determined. This can be done, for example, using suitable sensors.

SUMMARY

The disclosure determines the information required for controlling the generator operation as simply and energy-saving as possible and to provide an electromechanical drive suitable for this purpose.

This advantage is achieved by providing a method for determining at least one property of a rotational movement of a three-phase rotary current machine in generator operation, with an electrical parameter for a phase voltage of the relevant phase of the three-phase alternating voltage of the rotary current machine generated in generator operation being continuously recorded metrologically for each of the three phases, with three electrical parameter pairs being formed from the three electrical parameters, so that a first electrical parameter pair comprises the electrical parameters of a first and a second phase, a second electrical parameter pair comprises the electrical parameters of the second phase and a third phase, and a third electrical parameter pair comprises the electrical parameters of the third phase and the first phase, with a sign of a difference between the electrical parameters of each parameter pair being continuously determined, and with the property of the rotational movement being determined from change times, with the change times corresponding to times of immediately successive sign changes of the differences between the three parameter pairs. In this way, the information required for controlling the electromechanical drive or the rotary current machine in generator operation can be at least partially determined from the phase voltages of the rotary current machine. The property, such as the movement direction or the speed, is thereby determined by determining the times at which the differences between the phase voltages or the electrical parameters for the phase voltages change sign, i.e. pass through the zero point. In a rotary current machine in generator operation, the phase voltages of the three phases each have a sinusoidal course, with this course being shifted by 120° between the phases. The absolute values of the phase voltages of the three phases are almost identical except for this phase shift. The differences from the phase voltages therefore again have a sinusoidal course that runs symmetrically around the value zero. The times of the zero crossings or sign changes can be determined particularly easily and in an energy-saving manner and are well suited for determining the movement direction and the movement speed. The electrical parameters for the phase voltages represent a measure for the phase voltages and do not have to be converted to an actual voltage value, for example in the unit of volts, in order to determine the at least one property. For example, voltage values determined directly through the use of Hall sensors or the like can advantageously be used to form the differences and determine the change times. This saves a further calculation step and therefore represents an energy-efficient way to determine the at least one property.

In order to be able to determine the movement direction particularly easily, it is provided according to the disclosure that the property of the rotational movement is a direction of rotation of the rotary current machine, with the direction of rotation being determined from a time sequence of the sign changes of the three parameter pairs determined by the change times. The electrical parameters for the phase voltages $U_1$, $U_2$, $U_3$ run sinusoidally and 120° out of phase with each other. The differences between the parameter pairs determined from the electrical parameters $\Delta U_{1,2}$, $\Delta U_{2,3}$, $\Delta U_{3,1}$ also run sinusoidally and 120° out of phase with each other. The time sequence of the sign changes of the differences between the parameter pairs, determined by the change times, is thereby dependent on the direction of rotation. For example, if the time sequence of the sign changes of the parameter pairs $\Delta U_{1,2}$, $\Delta U_{2,3}$, $\Delta U_{3,1}$ is viewed from plus (+) to minus (−), the sequence $\Delta U_{1,2}$, $\Delta U_{2,3}$, $\Delta U_{3,1}$ can be set in one direction of rotation and the sequence $\Delta U_{1,2}$, $\Delta U_{3,1}$, $\Delta U_{2,3}$ can be set in the other direction of rotation. The same applies to the time sequence of the sign changes from minus (−) to plus (+). By determining the time sequence of the sign changes determined by the change times, the direction of rotation can be easily determined.

According to the disclosure, it is advantageously provided that the property of the rotational movement is a rotational speed measure of the rotary current machine, with time differences being determined from the change times and the rotational speed measure being determined from the time differences. The time differences between the change times depend on a speed or the rotational speed of the rotary current machine. The faster a rotor of the rotary current machine rotates, the shorter the time differences become. The rotational speed is thereby directly proportional to the time differences. Therefore, a measure for the rotational speed, the rotational speed measure, can be determined from the time differences.

In order to determine the rotational speed as precisely as possible, it is provided according to the disclosure that the property of the rotational movement is a rotational speed of the rotary current machine, with the rotational speed being determined from the rotational speed measure and a pole pair count of the rotary current machine. A number of complete periods of the sinusoidal phase voltage course induced in each phase of the rotary current machine during one revolution of the rotor of the rotary current machine depends on the pole pair count of the rotary current machine. Therefore, the number of change times during a complete revolution of the rotor also depends on the pole pair count. If the pole pair count is also taken into account in the calculation in addition to the time differences between the change times, the rotational speed can be determined.

According to the disclosure, it is advantageously provided that the rotational speed $\omega$ is determined from a time difference $\Delta t$ and the pole pair count p of the rotary current machine according to the following calculation rule:

$$\omega = \frac{\frac{360°}{6p}}{\Delta t}$$

In order to further improve the accuracy of the determined rotational speed, it is provided according to the disclosure that the property is an average rotational speed, with the average rotational speed being an average value of a plurality of rotational speed measures or rotational speeds determined according to one of the methods described above. By averaging, deviations that result, for example, from a sampling frequency of the electrical parameters, can be compensated for.

According to the disclosure, it is advantageously provided that differences between the parameter pairs $\Delta U_{1,2}$, $\Delta U_{2,3}$, $\Delta U_{3,1}$ of the electrical parameters for the phase voltages $U_1$, $U_2$, $U_3$ are determined at determination times t according to the following calculation rules:

$$\Delta U_{1,2}(t)=U_1(t)-U_2(t)$$

$$\Delta U_{2,3}(t)=U_2(t)-U_3(t)$$

$$\Delta U_{3,1}(t)=U_3(t)-U_1(t)$$

In a particularly advantageous configuration of the method according to the disclosure, it is provided that the signs of the differences are determined by an electronic comparator. With the help of comparators, the signs of the differences can be determined directly without explicitly determining the differences. This represents a particularly efficient configuration of the method. Advantageously, comparators integrated into a microcontroller provided for carrying out the method can be used for this purpose.

Advantageously, the differences and/or the signs of the differences are continuously determined at predetermined time intervals. The method is advantageously carried out digitally electronically, so that a sampling of the electrical parameter is required at predefined intervals or with a sampling frequency. By sampling the electrical parameters and using the comparators of a microcontroller, the method can be made particularly energy-efficient, since the comparators are not used between the sampling times.

According to the disclosure, it is advantageously provided that the predefined time intervals are specified such that the at least one property is determined with an accuracy of at least 10%. A relative error $\omega_{err}$ of the speed determination of the rotational speed $\omega$ caused by the specified times or the sampling rate, from which the accuracy of the speed determination can be determined, can be determined as a function of the sampling rate $f_{sample}$, the specified time intervals $$\Delta_t = \frac{1}{f_{sample}}$$

and the pole pair count p as follows:

Maximum measurement errors:

$$\Delta t, err = \pm \frac{2}{f_{sample}}$$

Rotational speed with measurement error:

$$\omega_{ges} = \frac{\left((360°)/6p\right)}{(\Delta t + \Delta t_{err})}$$

Relative measurement error:

$$\omega_{err} = \frac{\omega_{ges}}{\omega} - 1$$

The advantage set at the outset is also achieved by providing an electromechanical drive for actuating a leaf, in particular a door leaf or a window leaf, rotatably and/or displaceably mounted on a structural element, with the electromechanical drive having a three-phase rotary current machine, with a drive shaft of the rotary current machine being operatively connected to the leaf via a power transmission device when the electromechanical drive is mounted as intended on the leaf and/or the structural element, so that a movement of the drive shaft in motor operation of the rotary current machine causes a movement of the leaf, with a movement of the leaf in generator operation of the rotary current machine causing a movement of the drive shaft, with the electromechanical drive having a determining device, with the determining device having measuring elements for each of the three phases for recording an electrical parameter for a phase voltage of the relevant phase of the three-phase rotary current of the rotary current machine generated in generator operation, with the measuring elements being connected to an electronic evaluation unit of the determining device in a wired or wireless manner so as to transmit data, with the determining device being configured to carry out the method described above. The measuring elements can advantageously be Hall sensors.

The evaluation unit is advantageously a microcontroller.

Advantageously, it is provided according to the disclosure that the microcontroller has integrated comparators and the measuring elements are connected to comparator inputs of the comparators of the microcontroller in an electrically conductive manner. The integrated comparators can be used to directly determine the signs at specified time intervals. In this way, the method according to the disclosure can be carried out in a particularly energy-efficient manner.

According to the disclosure, it is advantageously provided that the rotary current machine is an axial or a radial flux machine. Axial or radial flux machines are particularly suitable for use with door or window drives.

According to the disclosure, it is advantageously provided that the electromechanical drive is a swing door leaf or sliding door or revolving door drive.

BRIEF DESCRIPTION OF THE DRAWINGS

Further advantageous configurations of the method according to the disclosure and the electromechanical drive according to the disclosure are explained in more detail on the basis of exemplary embodiments represented in the drawing.

They show.

DETAILED DESCRIPTION OF THE DRAWINGS

Figure 1:
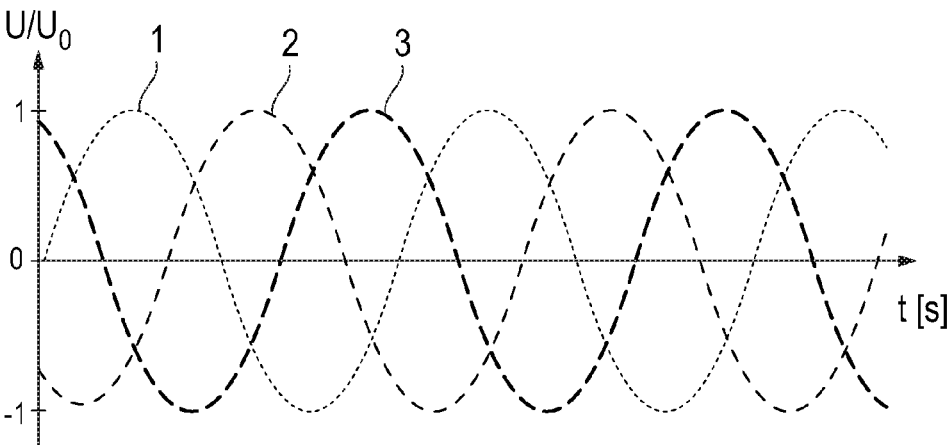
FIG. 1 three diagrams with schematically represented courses of phase voltages of a rotary current machine in generator operation as well as the determination of change times, and FIG. 2 a schematically represented sectional view of an electromechanical drive in which the method according to the disclosure can be used.
Figure 1:
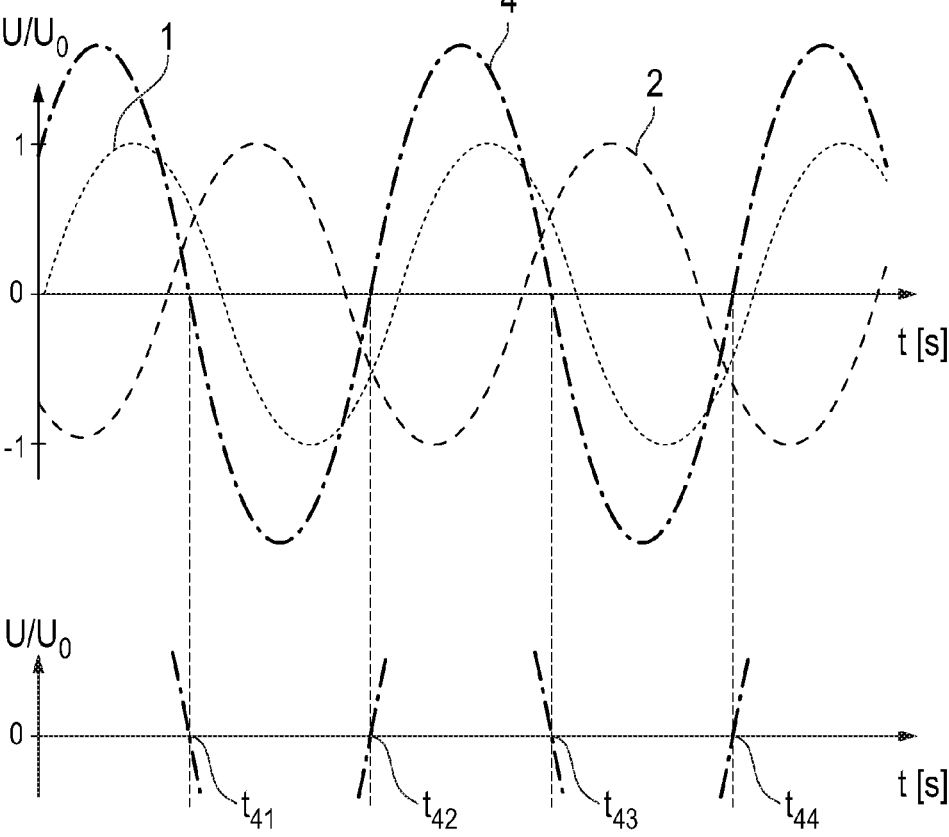

FIG. 1 shows, in the first diagram, schematically represented time courses of phase voltages 1, 2, 3 of phases of a three-phase rotary current machine in generator operation. The phase voltages 1, 2, 3 each have a sinusoidal course and are thereby 120° out of phase with each other.

Figure 2:
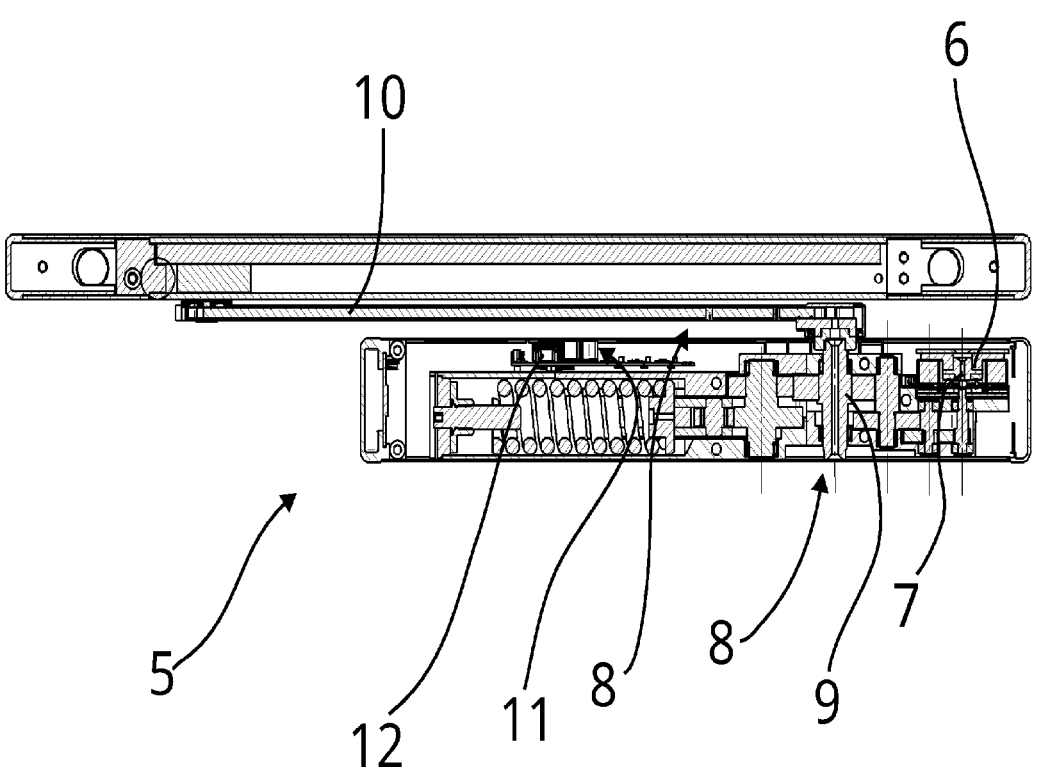

In the second diagram of FIG. 1, the phase voltages 1 and 2 from FIG. 1 are represented as well as the difference 4 between the two phase voltages 1 and 2. This difference 4 also has a sinusoidal course with a larger amplitude than the phase voltages 1 and 2. If the phase voltages 1 and 2 have the same amplitudes, the amplitude of the difference 4 would be √3 times larger than the amplitude of phase voltages 1 and 2. For the sake of clarity, only the difference 4 between the phase voltages 1 and 2 is represented in FIG. 2. The course of the differences between the phase voltages 2 and 3 and 3 and 1 corresponds to the course of the difference 4, shifted in phase by 120° or 240°.

Change times $t_{5,1}$, $t_{5,2}$, $t_{5,3}$, . . . of the difference 4 as well as change times $t_{4,1}$, $t_{4,2}$, $t_{4,3}$, . . . and $t_{6,1}$, $t_{6,2}$, $t_{6,3}$, . . . of the differences not represented are used to determine the properties of a rotational movement of the three-phase rotary current machine in generator operation, with the change times corresponding to times of immediately successive sign changes of the differences 4 between the three parameter pairs. If the change times are determined continuously or with a sufficiently large sampling frequency, the change times correspond to the times of the zero crossings of the differences 4, as is schematically illustrated in the third diagram of FIG. 1 on the basis of the zero crossings of the difference 4 represented in the second diagram. The change times $t_{4,1}$ . . . $t_{5,1}$ . . . and $t_{6,1}$ . . . are represented in FIG. 1 as t_41 . . . , t_51 . . . and t_61.

FIG. 2 schematically represents a sectional view of an electromechanical drive 5 for actuating a leaf, in particular a door leaf or a window leaf, rotatably and/or displaceably mounted on a structural element. The electromechanical drive 5 has a three-phase rotary current machine 6, which is configured as an axial flux machine. A drive shaft 7 of the rotary current machine 6 is operatively connected to the leaf, not represented, via a power transmission device 8. The power transmission device 8 comprises a gear 9 connected to the rotary current machine 6, and a lever 10. This converts a movement of the drive shaft 7 into a movement of the leaf during motor operation of the rotary current machine 6. A movement of the leaf in generator operation of the rotary current machine 6 causes a movement of the drive shaft 7 via the power transmission device 8. The electromechanical drive 5 also has a determining device 11 with an evaluation unit 12 and measuring elements, which are not represented and which are connected to the evaluation unit 12 so as to transmit data. With the measuring elements, an electrical parameter for a phase voltage of the relevant phase of the three-phase rotary current of the rotary current machine 6 generated in generator operation is determined for each of the three phases of the rotary current machine 6 and processed by the evaluation unit 12. The evaluation unit 12 is thereby configured such that a property of the rotational movement of the rotary current machine 6 in generator operation can be determined with the evaluation unit 12 from the electrical parameters for the phase voltages recorded with the measuring elements.

The invention claimed is:

1. A method for determining at least one property of a rotational movement of a three-phase rotary current machine in generator operation, the method including the following steps:

continuously recording an electrical parameter for a phase voltage of the relevant phase of the three-phase alternating voltage of the rotary current machine generated in generator operation metrologically for each of the three phases, forming three electrical parameter pairs from the three electrical parameters, whereby a first electrical parameter pair comprises the electrical parameters of a first and a second phase, a second electrical parameter pair comprises the electrical parameters of the second phase and a third phase, and a third electrical parameter pair comprises the electrical parameters of the third phase and the first phase, continuously determining a sign of a difference between the electrical parameters of each parameter pair, determining the property of the rotational movement from change times $(t_{4,1}, t_{4,2}, t_{4,3}, \ldots, t_{5,1}, t_{5,2}, t_{5,3}, \ldots, t_{6,1}, t_{6,2}, t_{6,3}, \ldots)$, wherein the change times $(t_{4,1}, t_{4,2}, t_{4,3}, \ldots, t_{5,1}, t_{5,2}, t_{5,3}, \ldots, t_{6,1}, t_{6,2}, t_{6,3}, \ldots)$ correspond to times of immediately successive sign changes of the differences between the three parameter pairs, and using the property of the rotational movement to control an electromechanical drive or the rotary current machine in generator operation.

2. The method according to claim 1, wherein the property of the rotational movement is a direction of rotation of the rotary current machine, and the method further includes the step of determining the direction of rotation from a time sequence of the sign change of the three parameter pairs determined by the change times $(t_{4,1}, t_{4,2}, t_{4,3}, \ldots, t_{5,1}, t_{5,2}, t_{5,3}, \ldots, t_{6,1}, t_{6,2}, t_{6,3}, \ldots)$.

3. The method according to claim 1, wherein the property of the rotational movement is a rotational speed measure of the rotary current machine, and the method further includes the step of determining time differences from the change times $(t_{4,1}, t_{4,2}, t_{4,3}, \ldots, t_{5,1}, t_{5,2}, t_{5,3}, \ldots, t_{6,1}, t_{6,2}, t_{6,3}, \ldots)$ and the rotational speed measure from the time differences and a pole pair count of the rotary current machine.

4. The method according to claim 3, wherein the property of the rotational movement is a rotational speed of the rotary current machine, and the method further includes the step of determining the rotational speed from the rotational speed measure and a pole pair count of the rotary current machine.

5. The method according to claim 4, wherein the method further includes the step of determining the rotational speed $\omega$ from a time difference $\Delta t$ and the pole pair count p of the rotary current machine according to the following calculation rule:

$$\omega = \frac{\frac{360°}{6p}}{\Delta t}.$$

6. The method according to claim 3, wherein the property is an average rotational speed, wherein the average rotational speed is an average value of a plurality of rotational speed measures or rotational speeds determined according to claim 3.

7. The method according to claim 1, wherein the method further includes the step of determining differences of the parameter pairs $\Delta U_{1,2}, \Delta U_{2,3}, \Delta U_{3,1}$, of the electrical parameters for the phase voltages $U_1, U_2, U_3$ at determination times t according to the following calculation rules:

$$\Delta U_{1,2}(t) = U_1(t) - U_2(t)$$

$$\Delta U_{2,3}(t) = U_2(t) - U_3(t)$$

$$\Delta U_{3,1}(t) = U_3(t) - U_1(t).$$

8. The method according to claim 1, wherein the method further includes the step of determining signs of the differences by an electronic comparator.

9. The method according to claim 1, wherein the method further includes the step of continuously determining differences and/or the signs of the differences at predefined time intervals.

10. The method according to claim 9, wherein the predefined time intervals are predefined such that the at least one property is determined with an accuracy of at least 10%.

11. An electromechanical drive for actuating a leaf, in particular a door leaf or a window leaf, rotatably and/or displaceably mounted on a structural element, wherein the electromechanical drive has a three-phase rotary current machine, wherein a drive shaft of the rotary current machine is operatively connected to the leaf via a power transmission device when the electromechanical drive is mounted as intended on the leaf and/or the structural element, so that a movement of the drive shaft in motor operation of the rotary current machine causes a movement of the leaf, wherein a movement of the leaf in generator operation of the rotary current machine causes a movement of the drive shaft, characterized in that the electromechanical drive has a determining device, wherein the determining device has measuring elements for each of the three phases for recording an electrical parameter for a phase voltage of the relevant phase of the three-phase rotary current of the rotary current machine generated in generator operation, wherein the measuring elements are connected to an electronic evaluation unit of the determining device in a wired or wireless manner so as to transmit data, wherein the determining device is configured to carry out the method according to claim 1.

12. The electromechanical drive according to claim 11, wherein the evaluation unit is a microcontroller.

13. The electromechanical drive according to claim 12, wherein the microcontroller has integrated comparators and the measuring elements are connected to comparator inputs of the comparators of the microcontroller in an electrically conductive manner.

14. The electromechanical drive according to claim 11, wherein the rotary current machine is an axial or a radial flux machine.

15. The electromechanical drive according to claim 11, wherein the electromechanical drive is a swing door leaf or sliding door or revolving door drive.

* * * * *